United States Patent
Liu et al.

(10) Patent No.: US 12,310,111 B2
(45) Date of Patent: May 20, 2025

(54) TOUCH DISPLAY DEVICE REDUCING RISK OF RESIDUAL CONDUCTIVE MATERIAL BETWEEN TOUCH SIGNAL LINES AND NEIGHBORING DATA LINES

(71) Applicants: Ordos Yuansheng Optoelectronics Co., Ltd., Inner Mongolia (CN); BOE Technology Group Co., Ltd., Beijing (CN)

(72) Inventors: Bin Liu, Beijing (CN); Hong Liu, Beijing (CN); Xinguo Wu, Beijing (CN); Fengguo Wang, Beijing (CN); Wenqiang Lv, Beijing (CN); Yu Feng, Beijing (CN); Liang Tian, Beijing (CN); Yuxuan Ma, Beijing (CN); Bo Ma, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/014,393

(22) PCT Filed: Dec. 16, 2021

(86) PCT No.: PCT/CN2021/138761
§ 371 (c)(1),
(2) Date: Jan. 4, 2023

(87) PCT Pub. No.: WO2023/108539
PCT Pub. Date: Jun. 22, 2023

(65) Prior Publication Data
US 2024/0250090 A1    Jul. 25, 2024

(51) Int. Cl.
*G06F 3/041*    (2006.01)
*G02F 1/1333*    (2006.01)
(Continued)

(52) U.S. Cl.
CPC ......... *H10D 86/60* (2025.01); *G02F 1/13338* (2013.01); *G02F 1/134372* (2021.01);
(Continued)

(58) Field of Classification Search
CPC ...... G06F 3/041; G06F 3/0412; G06F 3/0414; G06F 3/044; G06F 3/045; G06F 3/046;
(Continued)

(56) References Cited

U.S. PATENT DOCUMENTS

| | | | |
|---|---|---|---|
| 2012/0038567 A1* | 2/2012 | Kim | G06F 3/045 345/173 |
| 2013/0328812 A1* | 12/2013 | Kim | H01L 33/42 345/173 |

(Continued)

FOREIGN PATENT DOCUMENTS

| | | |
|---|---|---|
| CN | 104881170 A | 9/2015 |
| CN | 105094431 A | 11/2015 |

(Continued)

OTHER PUBLICATIONS

PCT/CN2021/138761 written opinion and international search report.

*Primary Examiner* — Ke Xiao
*Assistant Examiner* — Nelson Lam
(74) *Attorney, Agent, or Firm* — IPro, PLLC

(57) ABSTRACT

A display substrate and a display device are provided. The display substrate includes: a base substrate and a plurality of sub-pixels distributed in arrays and provided on the base substrate. And the plurality of sub-pixels is divided into a plurality of sub-pixel columns. The display substrate further includes: a plurality of data lines, each of which is coupled to respective sub-pixels at a corresponding sub-pixel column; a plurality of touch electrodes and a plurality of touch signal lines coupled to corresponding touch electrodes. Specifically an orthogonal projection of each of the touch (Continued)

signal lines on the base substrate is adjacent to an orthogonal projection of a corresponding data line among the plurality of data lines on the base substrate, and each of the touch signal lines comprises first touch portions and second touch portions coupled to each other, the first touch portions and the second touch portions being arranged in different layers, and the second touch portions being of the same material and provided in a same layer as the data lines.

18 Claims, 4 Drawing Sheets

(51) Int. Cl.
| | | |
|---|---|---|
| *G02F 1/1343* | (2006.01) | |
| *G02F 1/1362* | (2006.01) | |
| *G02F 1/1368* | (2006.01) | |
| *G06F 3/044* | (2006.01) | |
| *H10D 86/40* | (2025.01) | |
| *H10D 86/60* | (2025.01) | |

(52) U.S. Cl.
CPC .. *G02F 1/136209* (2013.01); *G02F 1/136286* (2013.01); *G02F 1/1368* (2013.01); *G06F 3/0412* (2013.01); *G06F 3/0445* (2019.05); *H10D 86/441* (2025.01); *G06F 3/0418* (2013.01); *G06F 2203/04103* (2013.01); *G06F 2203/04107* (2013.01)

(58) Field of Classification Search
CPC ........... G06F 3/047; G06F 2203/04104; G06F 2203/04105; G06F 2203/04106
USPC .................................................. 345/173–179
See application file for complete search history.

(56) References Cited

U.S. PATENT DOCUMENTS

| | | | | |
|---|---|---|---|---|
| 2014/0160066 | A1* | 6/2014 | Kim | G06F 3/0445 |
| | | | | 345/174 |
| 2014/0168149 | A1* | 6/2014 | Han | G06F 3/0412 |
| | | | | 345/174 |
| 2016/0041666 | A1* | 2/2016 | Lee | G06F 3/0412 |
| | | | | 345/174 |
| 2016/0048267 | A1* | 2/2016 | Lee | G06F 3/0443 |
| | | | | 345/173 |
| 2016/0320882 | A1 | 11/2016 | Kim et al. | |
| 2016/0378254 | A1* | 12/2016 | Wang | G06F 3/0443 |
| | | | | 345/174 |
| 2018/0188858 | A1 | 7/2018 | Zhang et al. | |
| 2018/0196536 | A1 | 7/2018 | Li et al. | |
| 2020/0019294 | A1* | 1/2020 | Lee | H10K 50/865 |
| 2022/0107706 | A1* | 4/2022 | Lu | H10D 86/441 |
| 2022/0179519 | A1* | 6/2022 | Hsu | G06F 3/0446 |
| 2022/0317495 | A1 | 10/2022 | Feng et al. | |

FOREIGN PATENT DOCUMENTS

| | | |
|---|---|---|
| CN | 105468202 A | 4/2016 |
| CN | 105788466 A | 7/2016 |
| CN | 105845033 A | 8/2016 |
| CN | 206162460 U | 5/2017 |
| CN | 112416174 A | 2/2021 |
| CN | 112782886 A | 5/2021 |
| CN | 113325638 A | 8/2021 |
| TW | 201101163 A | 1/2011 |

* cited by examiner

TOUCH DISPLAY DEVICE REDUCING RISK OF RESIDUAL CONDUCTIVE MATERIAL BETWEEN TOUCH SIGNAL LINES AND NEIGHBORING DATA LINES

CROSS-REFERENCE TO RELATED APPLICATION

This application is the U.S. national phase of PCT Application No. PCT/CN2021/138761 filed on Dec. 16, 2021, the disclosure of which is incorporated in its entirety by reference herein.

TECHNICAL FIELD

The disclosure relates to a field of display technology, in particular to a display substrate and to a display device.

BACKGROUND

Along with continuous development of touch display technologies, touch display devices have an increasingly wide range of applications. Touch display devices integrate a touch function and a display function, and are capable of displaying an image as desired, and further capable of recognizing a user's touch position on a touch display device to realize a corresponding touch function.

To meet demands in more application scenarios, touch display devices have an increasing number of types, such as, narrow frame touch display devices, large size touch display devices, small size touch display devices, etc.

SUMMARY

An object of the present disclosure is to provide a display substrate and a display device.

To realize the foregoing purpose, the present disclosure provides the following technical solutions.

A display substrate according to a first aspect of the present disclosure, includes: a base substrate and a plurality of sub-pixels distributed in arrays and provided on the base substrate, wherein the plurality of sub-pixels are divided into a plurality of sub-pixel columns: the display substrate further includes: a plurality of data lines, each of which is coupled to respective sub-pixels at a corresponding sub-pixel column: a plurality of touch electrodes and a plurality of touch signal lines coupled to corresponding touch electrodes, wherein an orthogonal projection of each of the touch signal lines on the base substrate is adjacent to an orthogonal projection of a corresponding data line among the plurality of data lines on the base substrate, and each of the touch signal lines includes first touch portions and second touch portions coupled to each other, the first touch portions and the second touch portions being arranged in different layers, and the second touch portions being of the same material and provided in a same layer as the data lines.

Optionally, a part of each of the first touch portions is arranged between the second touch portions and the base substrate.

Optionally, the display substrate further includes a light-blocking layer, and the first touch portions are of the same material and provided in a same layer as the light-blocking layer.

Optionally, the plurality of sub-pixels are divided into a plurality of sub-pixel rows: the display substrate further includes a plurality of gate lines, each of which is coupled to respective sub-pixels at a corresponding sub-pixel row; and the first touch portions and the gate lines are of the same material and provided in a same layer.

Optionally, each of the first touch portions includes a molybdenum metal layer, an aluminum metal layer, and a molybdenum metal layer sequentially laminated and provided in a direction away from the base substrate.

Optionally, in a same touch signal line, a ratio of a sum of lengths of the first touch portions to a total length of an orthogonal projection of the touch signal line on the base substrate is greater than 50%.

Optionally, in a same touch signal line, each of the first touch portions and its neighboring second touch portion are coupled by a via hole.

Optionally, the plurality of sub-pixels are divided into a plurality of sub-pixel rows: the display substrate further includes a plurality of gate lines, each of which is coupled to respective sub-pixels at a corresponding sub-pixel row: along an extending direction of the data lines, orthogonal projections of the gate lines on the base substrate and orthogonal projections of the first touch portions on the base substrate are alternately arranged.

Optionally, the sub-pixels further include one or more pixel electrodes, and an orthogonal projection of each of the first touch portions on the base substrate does not overlap with an orthogonal projection of each of the pixel electrodes on the base substrate.

Optionally, the sub-pixels further include one or more common electrodes, and an orthogonal projection of each of the first touch portions on the base substrate at least partially overlaps with an orthogonal projection of each of the common electrodes on the base substrate.

Optionally, orthogonal projections of at least some of the second touch portions on the base substrate partially overlap with orthogonal projections of the gate lines on the base substrate.

Optionally, the data lines and the sub-pixel columns are alternately arranged: the plurality of data lines include a plurality of first data lines and a plurality of second data lines, wherein the plurality of touch signal lines correspond to the plurality of first data lines in a one-to-one manner, and each of the touch signal lines is adjacent to a corresponding first data line among the plurality of first data lines; at least a part of neighboring touch signal lines and first data lines are arranged between two neighboring sub-pixel columns; each of the first data lines includes first data portions and second data portions alternately provided along an extending direction of the first data lines, the second data portions being coupled to respective control transistors in corresponding sub-pixels: each of the second data lines includes third data portions, fourth data portions, and fifth data portions arranged sequentially and repeatedly, wherein the fourth data portions are coupled to respective control transistors in corresponding sub-pixels, and orthogonal projections of the fifth data portions on the base substrate at least partially overlap with orthogonal projections of the gate lines on the base substrate: a width of each of the third data portions in a direction perpendicular to an extending direction of the third data portions is greater than a width of each of the first data portions in a direction perpendicular to an extending direction of the first data portions, and is greater than a width of each of the first touch portions in a direction perpendicular to an extending direction of the first touch portions.

Optionally, the plurality of sub-pixel columns are divided into a plurality of pixel unit columns, each of which includes at least two neighboring sub-pixel columns, wherein the touch signal lines and the pixel unit columns are alternately provided.

Optionally, each of the sub-pixels includes a control transistor having its gate electrode coupled to a corresponding gate line and having its first pole coupled to a corresponding data line, and a pixel electrode to which a second pole of the control transistor is coupled: the display substrate further includes a light-blocking layer including a plurality of light-blocking patterns, wherein orthogonal projections of the light-blocking patterns on the base substrate at least partially overlap with orthogonal projections of channel portions of corresponding control transistors on the base substrate.

Based on the technical solutions of the display substrate described above, a second aspect of the present disclosure provides a display device including the display substrate described above.

BRIEF DESCRIPTION OF THE DRAWINGS

The following drawings are provided to facilitate the understanding of the present disclosure, and constitute a portion of the description. Exemplary embodiments and descriptions thereof herein are for illustrative purposes only, but shall not be construed as limiting the present disclosure. In these drawings.

DETAILED DESCRIPTION

Figure 1:
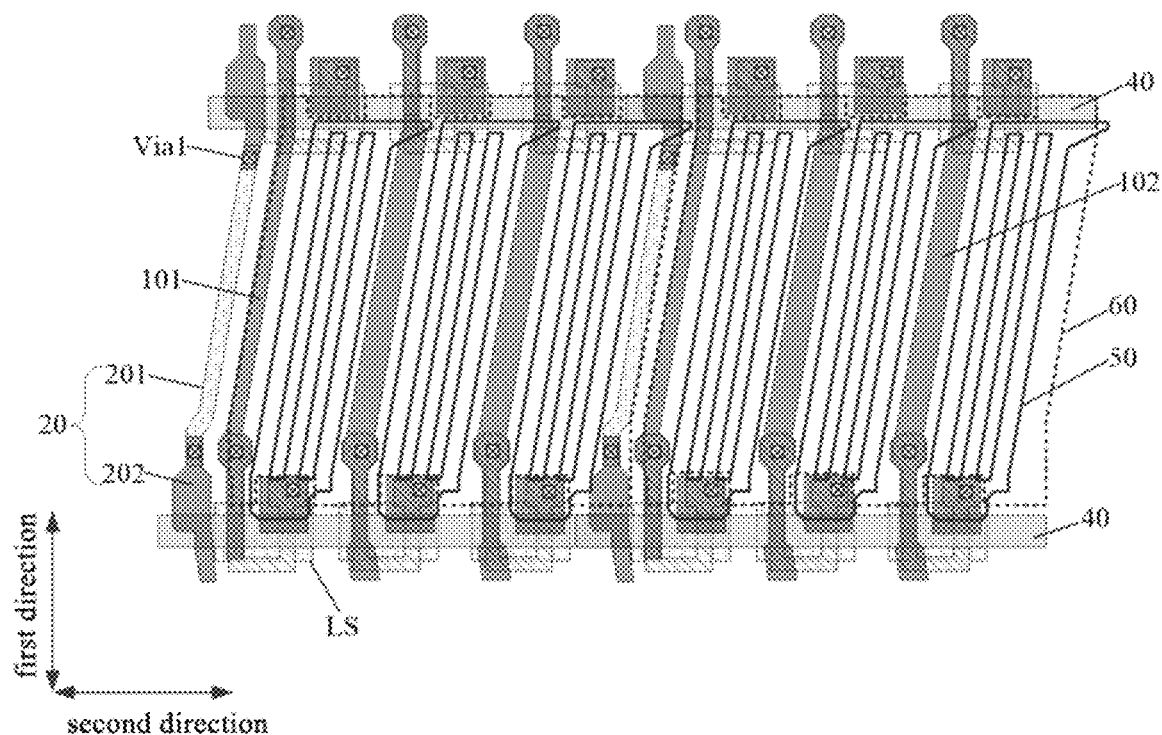
FIG. 1 is a diagram showing a first arrangement of a display substrate according to embodiments of the present disclosure.

To further illustrate the display substrate and the display device according to embodiments of the present disclosure, they will be described hereinafter in conjunction with the drawings.

A touch display device includes gate lines and a plurality of data lines, wherein the gate lines and the data lines are provided in a grid manner, defining a plurality of sub-pixels. The touch display device further includes a plurality of touch electrodes and a plurality of touch signal lines coupled to corresponding touch electrodes. The touch signal lines and the data lines are of the same material and provided in a same layer, and the touch signal lines and a part of the data lines are adjacent to each other.

In the touch display device described above, the touch signal lines and the data lines are of the same material and provided in a same layer, which both are formed in a same patterning process.

The patterning process generally includes forming a layer of conductive material. Photoresists are then formed on the layer of conductive material, and the photoresists are exposed using masks to form photoresist retention areas and photoresist removal areas, wherein the photoresist retention areas correspond to areas where the touch signal lines and the data lines are positioned and the photoresist removal areas correspond to areas other than areas where the touch signal lines and the data lines are positioned. The photoresists in the photoresist removal areas are removed using developer solution. As masks, the remaining photoresists in the photoresist retention areas are used to etch away the layer of conductive material exposed in the photoresist removal areas. Finally, the remaining photoresists are removed, and the touch signal lines and the data lines are then formed.

Since the touch signal lines and the data lines are adjacent to each other in partial regions of the touch display device such that a spacing between each of the touch signal lines and a data line adjacent thereto among the plurality of the data lines is small, and thus it is difficult to avoid residual conductive material between each of the touch signal lines and a data line adjacent thereto among the plurality of the data lines during the above etching process, resulting in an unwanted short circuit between a touch signal line and its neighboring data line.

Due to a limited detection ability of automatic optical inspection (AOI) equipment, some of defects may be missed, thereby causing subsequently-formed touch display devices to exhibit poor grid lines when displaying. An occurrence rate of the defects can reach 1.5%, and it can reach around 4% for large size touch display products.

Referring to FIGS. 1 to 5, a display substrate includes: a base substrate and a plurality of sub-pixels distributed in arrays and provided on the base substrate, wherein the plurality of sub-pixels are divided into a plurality of sub-pixel columns; the display substrate further includes: a plurality of data lines 10 including first data lines 101 and second data lines 102, each of which is coupled to respective sub-pixels at a corresponding sub-pixel column: a plurality of touch electrodes and a plurality of touch signal lines 20 coupled to corresponding touch electrodes, wherein an orthogonal projection of each of the touch signal lines 20 on the base substrate is adjacent to an orthogonal projection of a corresponding data line 10 among the plurality of the data lines on the base substrate, and each of the touch signal lines 20 includes first touch portions 201 and second touch portions 202 coupled to each other, the first touch portions 201 and the second touch portions 202 being arranged in different layers, and the second touch portions 202 being of the same material and provided in a same layer as the data lines 10.

Exemplarily, the plurality of sub-pixels are divided into a plurality of sub-pixel rows and a plurality of sub-pixel columns. The plurality of sub-pixel rows are arranged along a first direction, and each sub-pixel row includes a plurality of sub-pixels arranged along a second direction. The plurality of sub-pixel columns are arranged along the second direction, and each sub-pixel column includes a plurality of sub-pixels arranged along the first direction. Exemplarily, the first direction intersects the second direction. The first direction for example includes a longitudinal direction and the second direction for example includes a transverse direction.

Exemplarily, the display substrate also includes a plurality of gate lines 40 including at least portions extending along the second direction and a plurality of data lines 10 including at least portions extending along the first direction. The plurality of gate lines 40 correspond to the plurality of sub-pixel rows in a one-to-one manner. The plurality of data lines 10 correspond to the plurality of sub-pixel columns in a one-to-one manner.

Exemplarily, each sub-pixel includes a pixel opening area which is an effective light-emitting area of the sub-pixel.

Exemplarily, the touch electrodes are distributed in form of arrays, and an orthogonal projection of each touch electrode on the base substrate at least partially overlaps with orthogonal projections of at least two pixel openings on the base substrate.

Exemplarily, the touch signal lines 20 include at least portions extending along the first direction. The touch signal lines 20 are coupled to corresponding touch electrodes thereof, and the touch signal lines 20 are capable of transmitting touch signals from the touch electrodes coupled thereto.

Exemplarily, the plurality of touch signal lines 20 correspond to at least some of the data lines 10 in a one-to-one manner, and an orthogonal projection of each of the touch signal lines 20 on the base substrate is adjacent to an orthogonal projection of a corresponding data line 10 among the plurality of data lines on the base substrate. Each of the touch signal lines 20 and its corresponding data line 10 are arranged between two neighboring columns of pixel opening areas.

Exemplarily, there are insulation layers between the first touch portions 201 and the second touch portions 202, and the first touch portions 201 and the second touch portions 202 are formed in different patterning processes, respectively. The second touch portions 202 and the data lines 10 are of the same material and provided in a same layer, and they can be formed simultaneously in a same patterning process.

According to specific structure of the display substrate described above, in the display substrate according to embodiments of the present disclosure, through providing that each of the touch signal lines 20 includes first touch portions 201 and second touch portions 202 coupled to each other, that the first touch portions 201 and the second touch portions 202 are provided in different layers, and that the second touch portions 202 and the data lines 10 are of the same material and provided in a same layer, the first touch portions 201 in each of the touch signal lines 20 can be provided in a different layer from the data lines 10, so that the first touch portions 201 can be formed in a different patterning process from the data lines 10, reducing a proportion of wirings provided adjacent to each other in a same layer between the touch signal lines 20 and corresponding data lines 10 thereof, thereby reducing a risk of residual conductive material between the touch signal lines 20 and neighboring data lines 10 thereof during etching process, improving manufacturing yield of the touch signal lines 20 and neighboring data lines 10 thereof, and reducing the probability of defective grid lines of display substrates during display effectively.

Figure 3:
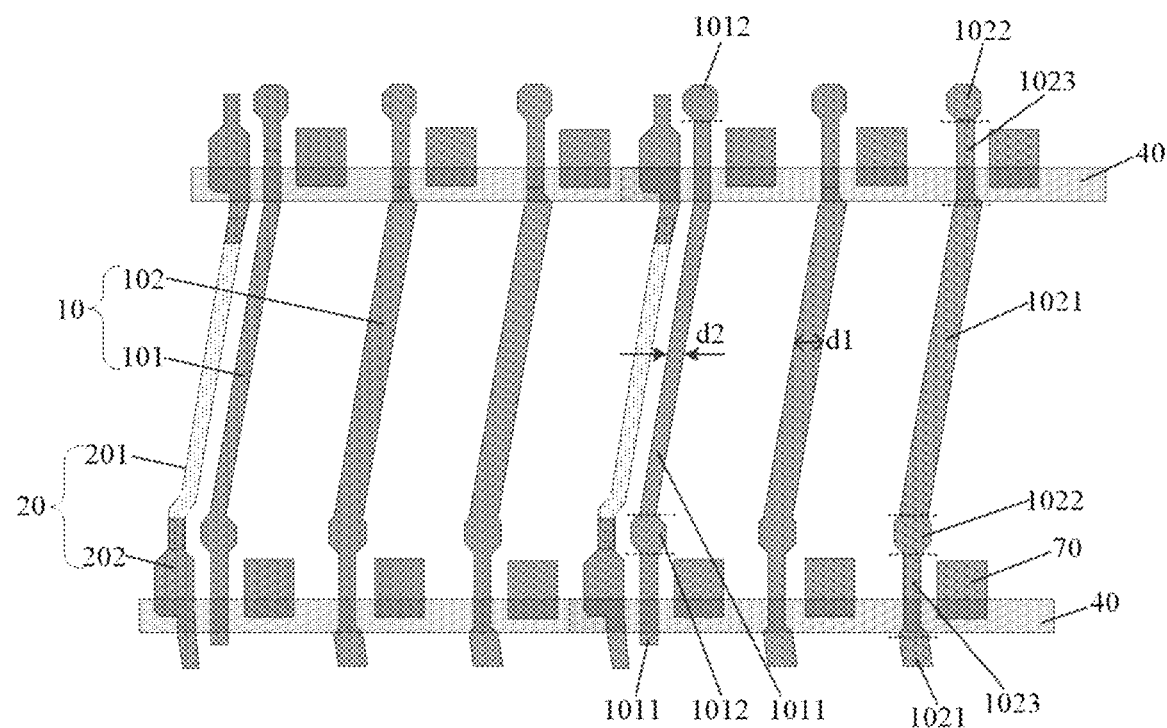
FIG. 3 is a diagram showing an arrangement of gate lines and data lines and touch signal lines as shown in FIG. 3.
Figure 4:
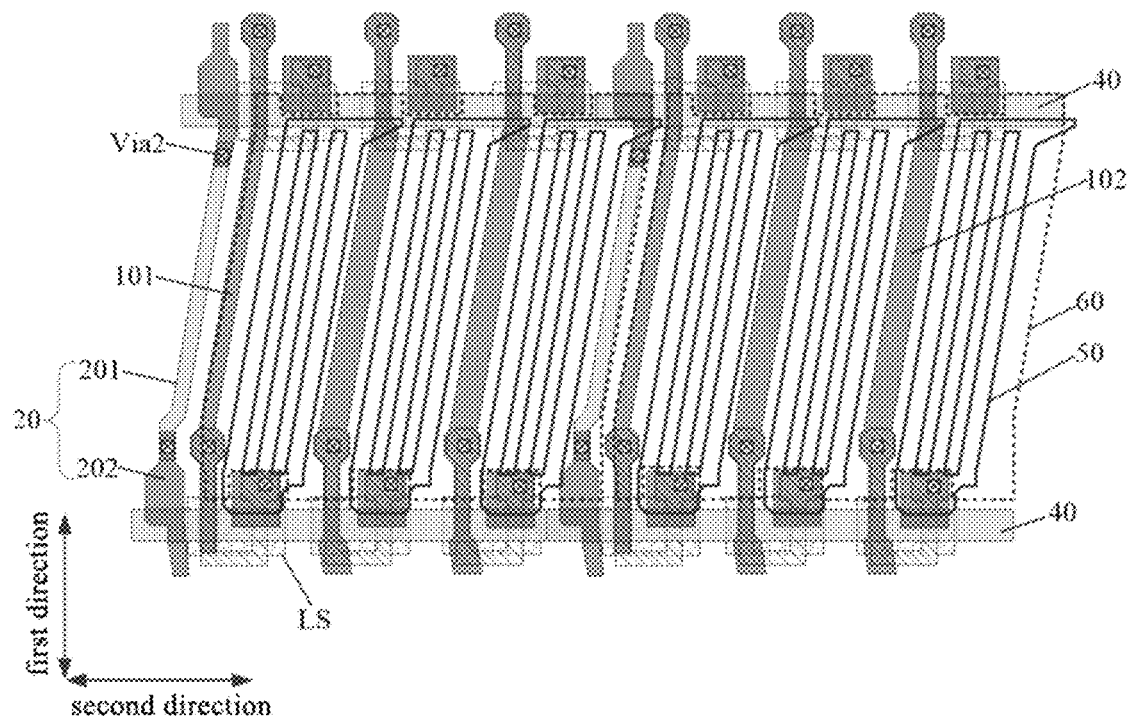
FIG. 4 is a diagram showing a second arrangement of a display substrate according to embodiments of the present disclosure.

As shown in FIGS. 1, 3 and 4, in some embodiments, a part of each of the first touch portions 201 is arranged between the second touch portions 202 and the base substrate.

Exemplarily, the first touch portions 201 are closer to the base substrate of the display substrate than the second touch portions 202.

Exemplarily, in a same touch signal line 20, orthogonal projections of the first touch portions 201 on the base substrate and orthogonal projections of neighboring second touch portions 202 thereof on the base substrate have overlapping areas where the first touch portions 201 are arranged between the second touch portions 202 and the base substrate.

Exemplarily, the first touch portions 201 may be of the same material and provided in a same layer as conductive structures between the second touch portions 202 and the base substrate, such that the first touch portions 201 can be formed simultaneously with the conductive structures in a same patterning process, avoiding additional patterning processes for fabricating the first touch portions 201, thereby effectively simplifying fabrication process for display substrates and reducing fabrication cost of display substrates.

In some embodiments, a part of each of the second touch portions 202 is arranged between the first touch portions 201 and the base substrate.

Exemplarily, the second touch portions 202 are closer to the base substrate of the display substrate than the first touch portions 201.

Exemplarily, in a same touch signal line 20, orthogonal projections of the first touch portions 201 on the base substrate and orthogonal projections of neighboring second touch portions 202 thereof on the base substrate have overlapping areas where the second touch portions 202 are arranged between the first touch portions 201 and the base substrate.

Exemplarily, the first touch portions 201 may be of the same material and provided in a same layer as conductive structures on the side of the second touch portions 202 facing away from the base substrate, such that the first touch portions 201 can be formed simultaneously with the conductive structures in a same patterning process, avoiding additional patterning processes for fabricating the first touch portions 201, thereby effectively simplifying fabrication process for display substrates and reducing fabrication cost of display substrates.

Figure 2:
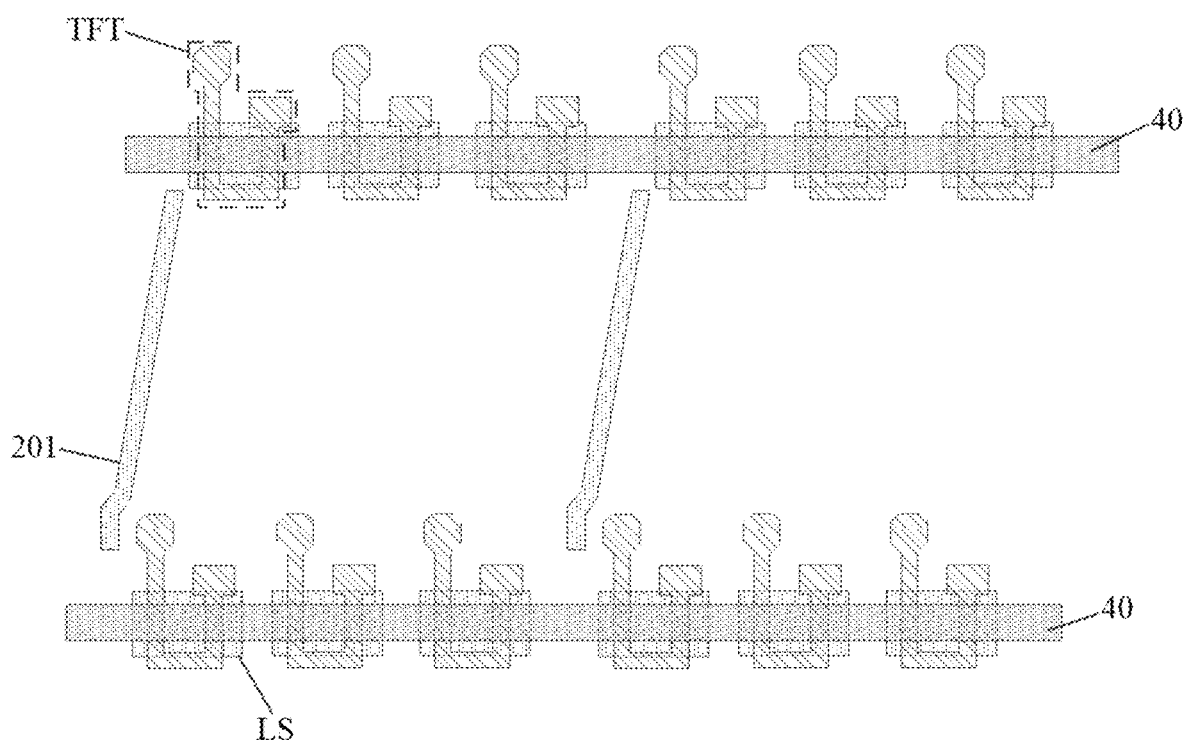
FIG. 2 is a diagram showing an arrangement of a light-blocking layer and an active layer and a gate metal layer as shown in FIG. 1.

As shown in FIGS. 1 to 3, in some embodiments, the display substrate further includes a light-blocking layer, and the first touch portions 201 are of the same material and provided in a same layer as the light-blocking layer (including light-blocking patterns LS).

Exemplarily, for a narrow frame display substrate, fan-out lines in the display substrate may be fabricated using the light-blocking layer.

Exemplarily, the light-blocking layer includes a first molybdenum metal layer, an aluminum metal layer, and a second molybdenum metal layer sequentially laminated and provided in a direction away from the base substrate. Exemplarily, the first molybdenum metal layer has a thickness of 300 Å in a direction perpendicular to the base substrate, the aluminum metal layer has a thickness of 1300 Å in a direction perpendicular to the base substrate, and the second molybdenum metal layer has a thickness of 500 Å in a direction perpendicular to the base substrate.

In the display substrate according to the above embodiments, the first touch portions 201 are of the same material and provided in a same layer as the light-blocking layer, such that the first touch portions 201 can be formed simultaneously with the light-blocking layer in a same patterning process, avoiding additional patterning processes for fabricating the first touch portions 201, thereby effectively simplifying fabrication process for display substrates and reducing fabrication cost of display substrates.

Figure 5:
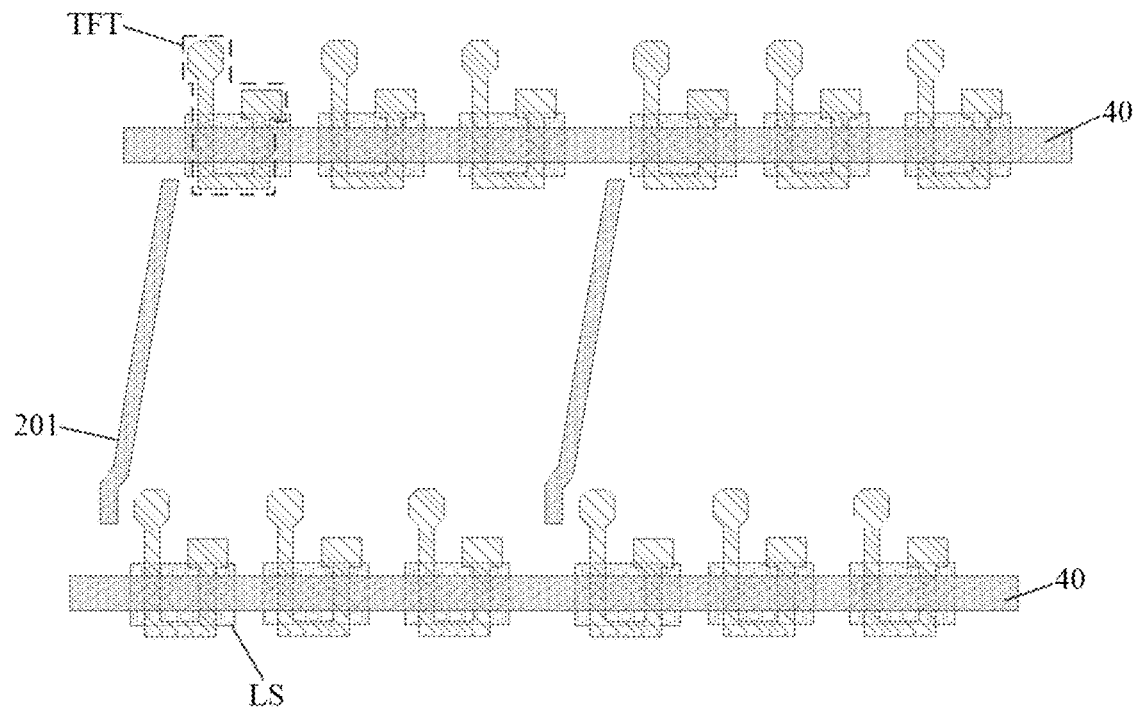
FIG. 5 is a diagram showing an arrangement of a light-blocking layer and an active layer and a gate metal layer as shown in FIG. 4.

As shown in FIGS. 4 and 5, in some embodiments, the plurality of sub-pixels is divided into a plurality of sub-pixel rows: the display substrate further includes a plurality of gate lines 40, each of which is coupled to respective sub-pixels at a corresponding sub-pixel row: and the first touch portions 201 and the gate lines 40 are of the same material and provided in a same layer.

Exemplarily, each of the gate lines 40 includes a first molybdenum metal layer, an aluminum metal layer, and a second molybdenum metal layer sequentially laminated and provided in a direction away from the base substrate. The gate lines 40 employing the structure described above can meet the gate line loading requirement from large size display substrates. It is also possible to meet the line resistance requirement from touch signal lines 20 in large size display substrates, i.e., less than 0.1 Ω/sq.

In the display substrate according to the above embodiments, the first touch portions 201 are of the same material and provided in a same layer as the gate lines 40, such that the first touch portions 201 can be formed simultaneously with the gate lines 40 in a same patterning process, avoiding additional patterning processes for fabricating the first touch portions 201, thereby effectively simplifying fabrication process for display substrates and reducing fabrication cost of display substrates.

In some embodiments, each of the first touch portions 201 includes a molybdenum metal layer, an aluminum metal layer, and a molybdenum metal layer sequentially laminated and provided in a direction away from the base substrate.

TABLE 1

| Items | Mobile | TPC | NB | Vehicle-mounted | MNT |
|---|---|---|---|---|---|
| Dimensions | >5.9 inch FHD+ | >7.5 inch FHD+ | >10.95 inch WQ | >13.0 inch 3K2K | >13.0 inch WQHD | >31.5 inch 8K |
| Design Requirements | 1:4 MUX 144 Hz | 1:3 MUX 120 Hz | ← | 1:2 MUX 120 Hz | 60 Hz | ← |
| Mo (Rs: 0.45) | Charge Rate NG | Charge Rate NG | Charge Rate NG | Charge Rate & FLK Uniformity NG | FLK Uniformity NG | Failure to Charge/ Severe Charging Error |
| Al (Rs < 0.1) | Charge Rate OK | Charge Rate OK | Charge Rate OK | Charge Rate & FLK Uniformity OK | FLK Uniformity OK | Charge Rate OK |

It should be noted that, in Table 1, 3K, 2K, and 8K represent display substrate resolutions. Frequency in the design requirements refers to refresh frequency of a display substrate. Arrows in the table represent same contents as in neighboring blocks on the left. WQ represents a high definition screen with a resolution of 2560×1440 pixels, also known as a 2K display screen. FLK represents flicker.

TABLE 2

| Material | Mo | Al | | | |
|---|---|---|---|---|---|
| Film Thickness (Å) | 2800 | 3100 | 3800 | 4800 | 5800 |
| CD (μm) | 1.5 | 2.5 | ← | ← | ← |
| Rs (Ω/sq) | 0.45 | 0.11 | 0.091 | 0.073 | 0.06 |

TABLE 2-continued

| Material | Mo | Al | | | |
|---|---|---|---|---|---|
| R/C (kΩ/pf) | 209.43/ 171.11 | 30.72/ 230.92 | 25.41/ 235.13 | 20.38/ 243.52 | 16.75/ 252.75 |
| Charge Rate (31.5 inch MNT 8K) | 74% | 94.60% | 95.05% | 95.75% | 96.43% |

It should be noted that, CD in Table 2 represents critical dimensions. R/C represents a charge rate level.

Figure 6:
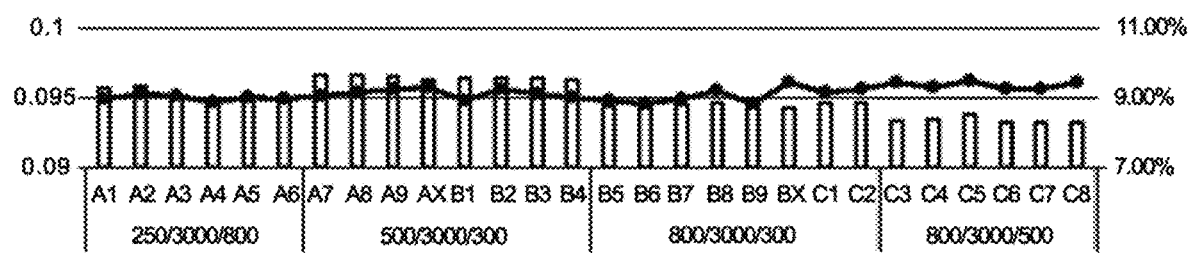
FIG. 6 is a diagram showing line resistance averages and resistance uniformity in testing a plurality of display substrates according to embodiments of the present disclosure.

As shown in FIG. 6, the abscissa represents display substrates under test. The left ordinate represents average resistance values of line resistances for 24 test points selected on the display substrates. The right ordinate represents uniformity of line resistances of the display substrates. Bar shapes in FIG. 6 illustrate average resistance values of line resistances for 24 test points in the display substrates. The curves illustrate uniformities of line resistances of the display substrates.

In FIG. 6, in display substrates of A1-A6, thicknesses corresponding to Mo/Al/Mo are 250/3000/800. In display substrates of A7-B4, thicknesses corresponding to Mo/Al/Mo are 500/3000/300. In display substrates of B5-C2, thicknesses corresponding to Mo/Al/Mo are 800/3000/300. In display substrates of C3-C8, thicknesses corresponding to Mo/Al/Mo are 800/3000/500. Units of above thicknesses are all Å. It should be noted that, Mo/Al/Mo refers to: Mo metal layer close to a base substrate/Al metal layer/Mo metal layer away from a base substrate.

Figure 7:
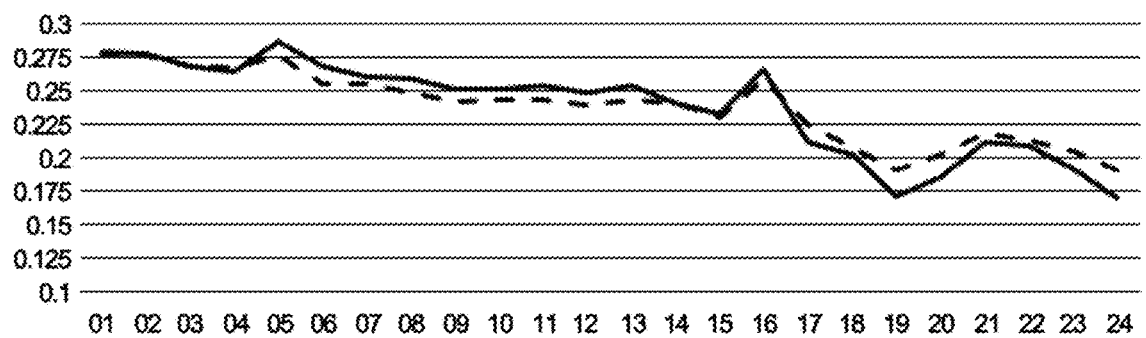
FIG. 7 is a diagram showing line resistance values at 24 positions where two display substrates are sampled according to embodiments of the present disclosure.

FIG. 7 shows line resistance values corresponding to 24 test points in two narrow frame display substrates (first touch portions and a light-blocking layer are of the same material and fabricated in a same layer). The abscissa represents 24 test points and the ordinate represents line resistance values in FIG. 7.

Referring to Table 1 and Table 2, FIG. 6 and FIG. 7 above, it is found through research that display products such as mainstream Mobile (mobile phone), TPC (tablet PC), NB (notebook) and the like gradually have requirements for higher frequency, while gate lines 40 manufactured with a single layer of molybdenum metal in display products cannot implement an extremely high frequency charging specification. MNT (displayer) large-size and high-resolution display products cannot display properly due to overloading and severe charging error. In vehicle-mounted display products and NB display products of medium size TDDI products, increased loading on gate lines 40 results in differences in coupling between gate lines 40 and common electrodes 60, causing in-plane flicker and poor display uniformity, and failing to meet product requirements.

A conductivity of metal Al is more suitable for medium to large sized products, but Al is susceptible to oxidation, requiring protection of Mo metal. Based on the above, it is ultimately determined after verification that gate lines 40 employ a molybdenum metal layer, an aluminum metal layer, and a molybdenum metal layer sequentially laminated and provided in a direction away from the base substrate, wherein the molybdenum metal layer close to the base substrate has a thickness of 800 Å in a direction perpendicular to the base substrate, the aluminum metal layer has a thickness of 3000 Å in a direction perpendicular to the base substrate, and the molybdenum metal layer away from the base substrate has a thickness of 500 Å in a direction perpendicular to the base substrate. The touch signal lines 20 realize wire jumper using the same layer structure as the gate lines 40, which can meet line resistance requirements from touch signal lines 20 in large size display substrates, i.e., less than 0.1 Ω/sq.

For narrow frame display substrates, fan-out lines in the display substrates are fabricated using the light-blocking layer. The light-blocking layer includes a molybdenum metal layer, an aluminum metal layer, and a molybdenum metal layer sequentially laminated and provided in a direction away from the base substrate. Exemplarily, the molybdenum metal layer close to the base substrate has a thickness of 300 Å in a direction perpendicular to the base substrate, the aluminum metal layer has a thickness of 1300 Å in a direction perpendicular to the base substrate, and the molybdenum metal layer away from the base substrate has a thickness of 500 Å in a direction perpendicular to the base substrate. The touch signal lines 20 realize wire jumper using the light-blocking layer, which can meet line resistance requirements from touch signal lines 20 in small-size and narrow frame display substrates, i.e., less than 0.3 Ω/sq.

In the display substrate according to the above embodiments, the first touch portions 201 are provided to include a molybdenum metal layer, an aluminum metal layer, and a molybdenum metal layer sequentially laminated and provided in a direction away from the base substrate, capable of meeting line resistance requirements from touch signal lines 20, and having high technology feasibility.

In some embodiments, in a same touch signal line 20, a ratio of a sum of lengths of the first touch portions 201 to a total length of an orthogonal projection of the touch signal line 20 on the base substrate is greater than 50%.

Exemplarily, the sum of lengths of the first touch portions 201 is a sum of lengths of the first touch portions 201 along an extending direction of the first touch portions 201.

Exemplarily, the total length of an orthogonal projection of the touch signal line 20 on the base substrate is a total length of an orthogonal projection of the touch signal line 20 on the base substrate along an extending direction of the touch signal line 20.

Exemplarily, in a same touch signal line 20, a ratio of a sum of lengths of the first touch portions 201 to a total length of an orthogonal projection of the touch signal line 20 on the base substrate is greater than 60%.

Exemplarily, in a same touch signal line 20, a ratio of a sum of lengths of the first touch portions 201 to a total length of an orthogonal projection of the touch signal line 20 on the base substrate includes 63%.

As mentioned above, in a same touch signal line 20, a ratio of a sum of lengths of the first touch portions 201 to a total length of an orthogonal projection of the touch signal line 20 on the base substrate is provided to be greater than 50%, effectively reducing a proportion of wirings provided adjacent to each other in a same layer between the touch signal lines 20 and corresponding data lines 10 thereof, thereby reducing a risk of residual conductive material between the touch signal lines 20 and neighboring data lines 10 thereof during etching process, improving manufacturing yield of the touch signal lines 20 and neighboring data lines 10 thereof, capable of reducing the probability of defective grid lines of the display substrates during display from 4% to 1.48%, and capable of increasing yield of the display substrates by 2.52%.

As shown in FIGS. 1, 4, 8 and 9, in some embodiments, in a same touch signal line 20, each of the first touch portions 201 and its neighboring second touch portion 202 are coupled by a via hole.

As shown in FIGS. 1, 4, 8 and 9, in some embodiments, in a same touch signal line 20, orthogonal projections of the first touch portions 201 on the base substrate and orthogonal projections of the second touch portions 202 on the base substrate are alternately arranged, and orthogonal projections of the first touch portions 201 on the base substrate and orthogonal projections of neighboring second touch portions 202 thereof on the base substrate have overlapping areas where the first touch portions 201 and neighboring second touch portions 202 thereof are coupled by via holes.

Exemplarily, a touch signal line 20 includes a plurality of first touch portions 201 and a plurality of second touch portions 202, wherein orthogonal projections of the first touch portions 201 on the base substrate and orthogonal projections of the second touch portions 202 on the base substrate are alternately arranged.

Exemplarily, each of the second touch portions 202 and each of the data lines 10 both include a titanium metal layer, an aluminum metal layer, and a titanium metal layer sequentially laminated and provided in a direction away from the base substrate.

Exemplarily, there is at least one insulation layer between each of the first touch portions 201 and a second touch portion 202 adjacent thereto among the second touch portions 202, and a via hole connecting each of the first touch portions 201 and a second touch portion 202 adjacent thereto among the second touch portions 202 penetrates the at least one insulation layer.

Figure 8:
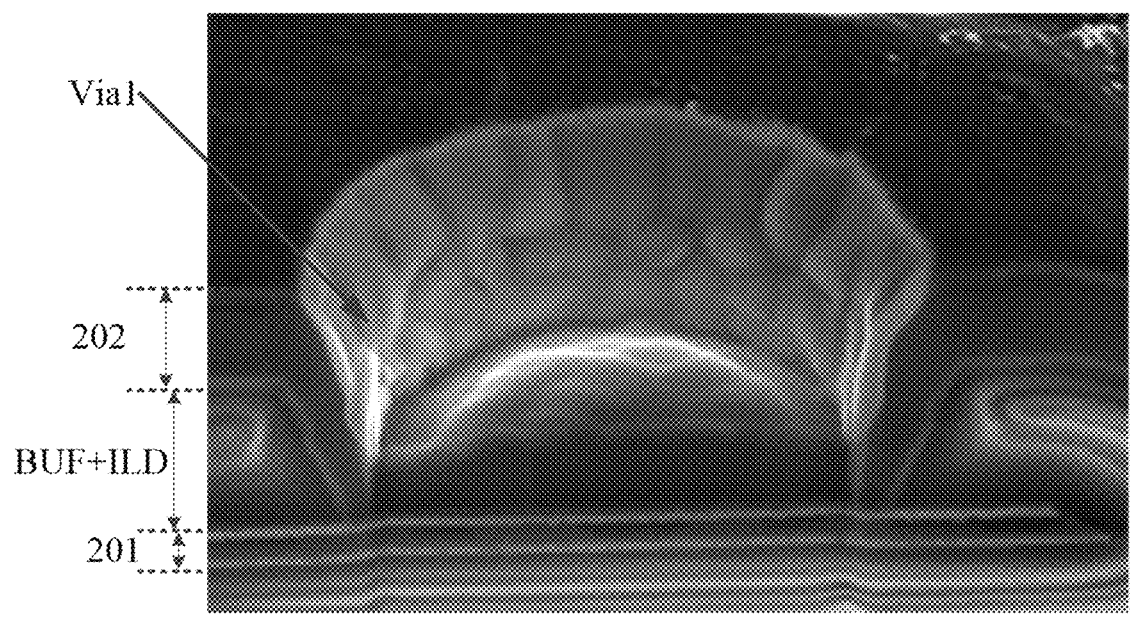
FIG. 8 is an electron microscope graph of a cross-sectional view of a via hole connecting a first touch portion and a second touch portion as shown in FIG. 1.

FIG. 8 shows a first touch portion 201 (of the same material and provided in a same layer as a light-blocking layer) and a second touch portion 202, and a via hole Via1 penetrating through an insulation layer (including a buffer layer BUF and an interlayer insulation layer ILD) between the first touch portion 201 and the second touch portion 202.

Figure 9:
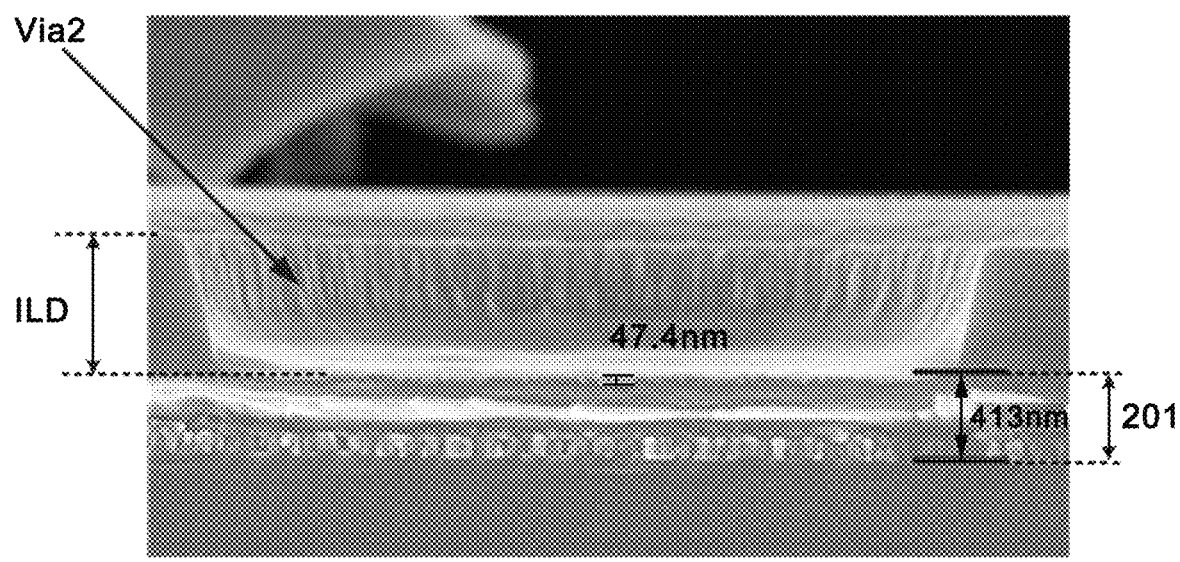
FIG. 9 is an electron microscope graph of a cross-sectional view of a via hole connecting a first touch portion and a second touch portion as shown in FIG. 3.

FIG. 9 shows a first touch portion 201 (of the same material and provided in a same layer as gate lines, with a thickness of 413 nm) and a via hole Via2 penetrating through the interlayer insulation layer ILD on the first touch portion 201. Also illustrated in FIG. 9 is a Mo metal layer away from the base substrate in the first touch portion 201 having a thickness of 47.4 nm.

Each of the first touch portions 201 is provided to include a first molybdenum metal layer, an aluminum metal layer, and a second molybdenum metal layer sequentially laminated and provided in a direction away from the base substrate. Each of the second touch portions 202 includes a titanium metal layer, an aluminum metal layer, and a titanium metal layer sequentially laminated and provided in a direction away from the base substrate. The touch signal lines 20 are jumpered using the first touch portions 201 and the second touch portions 202 of the above-mentioned structures, which can meet line resistance requirements of jumper wires well, with high technology feasibility and significant effects on improving yield of display substrates.

As shown in FIGS. 2 and 5, in some embodiments, the plurality of sub-pixels is divided into a plurality of sub-pixel rows: the display substrate further includes a plurality of gate lines 40, each of which is coupled to respective sub-pixels at a corresponding sub-pixel row: along an extending direction of the data lines 10, orthogonal projections of the gate lines 40 on the base substrate and orthogonal projections of the first touch portions 201 on the base substrate are alternately arranged.

Exemplarily, orthogonal projections of the first touch portions 201 on the base substrate do not overlap with orthogonal projections of the gate lines 40 on the base substrate.

Exemplarily, at least a part of an orthogonal projection of each of the first touch portions 201 on the base substrate is arranged between orthogonal projections of two neighboring gate lines 40 on the base substrate.

In the display substrate according to the above embodiments, through providing that along an extending direction of the data lines 10, orthogonal projections of the gate lines 40 on the base substrate and orthogonal projections of the first touch portions 201 on the base substrate are alternately arranged, a risk of short-circuiting the first touch portions 201 and the gate lines 40 is reduced.

Furthermore, the above configuration can achieve that the first touch portions 201 and the gate lines 40 are of the same material and provided in a same layer.

As shown in FIGS. 1 and 4, in some embodiments, it is provided that the sub-pixels further include one or more pixel electrodes 50, and an orthogonal projection of each of the first touch portions 201 on the base substrate does not overlap with an orthogonal projection of each of the pixel electrodes 50 on the base substrate.

Exemplarily, each of the pixel electrodes 50 is provided with a plurality of slits.

Exemplarily, each of the pixel electrodes 50 includes a portion positioned at a pixel opening area.

In the display substrate according to the above embodiments, through providing that orthogonal projections of the first touch portions 201 on the base substrate and orthogonal projections of the pixel electrodes 50 on the base substrate do not overlap, a risk of short-circuiting the first touch portions 201 and the pixel electrodes 50 is reduced, parasitic capacitance formed between the first touch portions 201 and the pixel electrodes 50 is avoided, and stability of the display substrate is effectively improved.

As shown in FIGS. 1 and 4, in some embodiments, the sub-pixels further include one or more common electrodes 60, and an orthogonal projection of each of the first touch portions 201 on the base substrate at least partially overlaps with an orthogonal projection of each of the common electrodes 60 on the base substrate.

Exemplarily, an orthogonal projection of each of the first touch portions 201 on the base substrate is covered by an orthogonal projection of each of the common electrodes 60 on the base substrate.

Exemplarily, a plurality of sub-pixels in the display substrate are divided into a plurality of pixel units, each of which includes at least two sub-pixels sequentially arranged along the second direction. Exemplarily, each of the pixel units includes a red sub-pixel, a green sub-pixel, and a blue sub-pixel sequentially arranged along the second direction. The display substrate includes a plurality of common electrodes 60 distributed in arrays, the plurality of common electrodes 60 corresponding to the plurality of pixel units in a one-to-one manner.

Exemplarily, orthogonal projections of the common electrodes 60 on the base substrate at least partially overlap with orthogonal projections of pixel opening areas included in corresponding pixel units on the base substrate.

Exemplarily, orthogonal projections of the common electrodes 60 on the base substrate cover orthogonal projections of pixel opening areas included in corresponding pixel units on the base substrate.

As shown in FIGS. 1 and 4, in some embodiments, it is provided that orthogonal projections of at least some of the second touch portions 202 on the base substrate partially overlap with orthogonal projections of the gate lines 40 on the base substrate.

Exemplarily, the second touch portions 202 and the data lines 10 are manufactured with a source-drain metal layer in the display substrate, and there are one or more insulation layers between each of the second touch portions 202 and the gate lines 40.

The above configuration is such that the touch signal lines 20 can cross the gate lines 40 through the second touch portions 202 without short-circuiting with the gate lines 40, ensuring yield of the display substrates.

As shown in FIGS. 1 and 3, in some embodiments, the data lines 10 and the sub-pixel columns are alternately arranged: the plurality of data lines 10 includes a plurality of first data lines 101 and a plurality of second data lines 102, wherein the plurality of touch signal lines 20 correspond to the plurality of first data lines 101 in a one-to-one manner, and each of the touch signal lines 20 is adjacent to a corresponding first data line 101 among the plurality of first data lines 101; at least a part of neighboring touch signal lines 20 and first data lines 101 are arranged between two neighboring sub-pixel columns: each of the first data lines 101 includes first data portions 1011 and second data portions 1012 alternately provided along an extending direction of the first data lines 101, the second data portions 1012 being coupled to respective control transistors TFT in corresponding sub-pixels; each of the second data lines 102 includes third data portions 1021, fourth data portions 1022, and fifth data portions 1023 arranged sequentially and repeatedly, wherein the fourth data portions 1022 are coupled to respective control transistors (TFTs) in corresponding sub-pixels, and orthogonal projections of the fifth data portions 1023 on the base substrate at least partially overlap with orthogonal projections of the gate lines 40 on the base substrate: a width d1 of each of the third data portions 1021 in a direction perpendicular to an extending direction of the third data portions 1021 is greater than a width d2 of each of the first data portions 1011 in a direction perpendicular to an extending direction of the first data portions 1011, and is greater than a width of each of the first touch portions 201 in a direction perpendicular to an extending direction of the first touch portions 201.

Exemplarily, the data lines and the sub-pixel columns are alternately arranged along the second direction.

Exemplarily, each of the first data lines 101 is coupled to respective sub-pixels at a corresponding sub-pixel column. Each of the second data lines 102 is coupled to respective sub-pixels at a corresponding sub-pixel column.

Exemplarily, the first data portions 1011 and the second data portions 1012 are formed as an integrated structure. Third data portions 1021, fourth data portions 1022, and fifth data portions 1023 are formed as an integrated structure. Both the first data line 101 and the second data line 102 are manufactured with a source-drain metal layer.

Exemplarily, orthogonal projections of the first data portions 1011 on the base substrate at least partially overlap with orthogonal projections of the gate lines 40 on the base substrate.

Exemplarily, a width of each of the first data portions 1011 in a direction perpendicular to an extending direction of the first data portions 1011 is equal to a width of each of the first touch portions 201 in a direction perpendicular to an extending direction of the first touch portions 201.

Exemplarily, a width of each of the first data portions 1011 in a direction perpendicular to an extending direction of the first data portions 1011 is 2.4 µm. A width of each of the first touch portions 201 in a direction perpendicular to an extending direction of the first touch portions 201 is 2.4 µm. A distance between an orthogonal projection of each of the first data portions 1011 on the base substrate and an orthogonal projection of a neighboring first touch portion 201 thereof among the plurality of first touch portions 201 on the base substrate is 2.6 µm.

In the display substrate according to the above embodiments, through providing that a width of each of the third data portions 1021 in a direction perpendicular to an extending direction of the third data portions 1021 is greater than a width of each of the first data portions 1011 in a direction perpendicular to an extending direction of the first data portions 1011, and is greater than a width of each of the first touch portions 201 in a direction perpendicular to an extending direction of the first touch portions 201: loads on the second data lines 102 are effectively reduced and transmission performances of the touch signal lines 20 and of the first data lines 101 are guaranteed while ensuring uniformity of distances between neighboring sub-pixel columns.

As shown in FIGS. 1 and 4, in some embodiments, the plurality of sub-pixel columns are divided into a plurality of pixel unit columns, each of which includes at least two neighboring sub-pixel columns, wherein the touch signal lines 20 and the pixel unit columns are alternately provided.

Exemplarily, each pixel unit column includes a column of red sub-pixels, a column of green sub-pixels, and a column of blue sub-pixels. The column of red sub-pixels includes a plurality of red sub-pixels, the column of green sub-pixels includes a plurality of green sub-pixels, and the column of blue sub-pixels includes a plurality of blue sub-pixels.

Exemplarily, the touch signal lines 20 and the pixel unit columns are alternately provided, and the first data lines 101 and the pixel unit columns are alternately provided.

As shown in FIGS. 1 to 5, in some embodiments, each of the sub-pixels includes a control transistor TFT having its gate electrode coupled to a corresponding gate line 40 and having its first pole coupled to a corresponding data line, and a pixel electrode 50 to which a second pole of the control transistor TFT is coupled: the display substrate further includes a light-blocking layer including a plurality of light-blocking patterns LS, wherein orthogonal projections of the light-blocking patterns LS on the base substrate at least partially overlap with orthogonal projections of channel portions of corresponding control transistors TFT on the base substrate.

Exemplarily, each of the pixel electrodes is provided with one or more slits.

Exemplarily, a second pole of each of the control transistors TFT is coupled to each of the pixel electrodes 50 through a conductive connection 70.

Exemplarily, each of the gate lines 40 is coupled to gate electrodes of respective control transistors TFT at a corresponding sub-pixel row, and each of the data lines is coupled to first poles of respective control transistors TFT at a corresponding sub-pixel column.

Exemplarily, each of the control transistors TFT includes a switching transistor, and each of the control transistors TFT can be turned on or off under the control of a gate line 40 coupled thereto. The control transistors TFT can transmit data voltages transmitted in the data lines coupled thereto to pixel electrodes 50 in sub-pixels to which the control transistors TFT belong.

Exemplarily, the plurality of light-blocking patterns LS are independent of each other, and they correspond to the plurality of sub-pixels in a one-to-one manner, wherein orthogonal projections of the light-blocking patterns LS on the base substrate at least partially overlap with orthogonal projections of channel portions of control transistors TFT in corresponding sub-pixels thereof on the base substrate. Exemplarily, orthogonal projections of the light-blocking patterns LS on the base substrate cover orthogonal projections of channel portions of control transistors TFT in corresponding sub-pixels thereof on the base substrate.

Embodiments of the present disclosure also provide a display device including a display substrate according to the above embodiments.

It should be noted that, the display device may be any product or component having a display function, such as a television, a display, a digital photo frame, a mobile phone, a tablet computer, and the display device further includes a flexible circuit board, a printed circuit board and a back plate, etc.

Exemplarily, the display device includes a touch and display driver integration (TDDI) display device. The display device includes large size TDDI display devices, small size TDDI display devices, and narrow frame TDDI display devices.

Exemplarily, the display device includes liquid crystal touch display devices.

In the display substrate according to the above embodiments, through providing that each of the touch signal lines includes first touch portions and second touch portions coupled to each other, that the first touch portions and the second touch portions are provided in different layers, and that the second touch portions and the data lines are of the same material and provided in a same layer, the first touch portions in each of the touch signal lines can be provided in a different layer from the data lines, so that the first touch portions can be formed in a different patterning process from the data lines, reducing a proportion of wirings provided adjacent to each other in a same layer between the touch signal lines and corresponding data lines thereof, thereby reducing a risk of residual conductive material between the touch signal lines and neighboring data lines thereof during etching process, improving manufacturing yield of the touch signal lines and neighboring data lines thereof, and reducing the probability of defective grid lines of display substrates during display effectively.

A display device according to the embodiments of the present disclosure includes the display substrate described above, and meanwhile also has advantageous effects mentioned above, which will not be repeated herein.

It should be noted that, in the embodiments of the present disclosure, signal lines extending in a X direction means that: signal lines include primary portions and secondary portions connected to primary portions, wherein the primary portions are lines, line segments or bar shapes, extending in a X direction, having a length extending in the X direction greater than a length of the secondary portions extending in other direction.

It should be noted that "in a same layer" of embodiments of the present disclosure may refer to layers located at a same structural layer. Or, for example, layers in a same layer may be a layer structure formed by: using a same film forming process to form layers for forming particular patterns, and then using a same mask to pattern the layers through a once patterning process. Depending on different particular patterns, the once patterning process may include multiple exposures, developments, or etching processes, and the particular patterns in the layer structure formed may or may not be continuous. These particular patterns may also be at different heights or have different thicknesses.

In method embodiments of the present disclosure, orders of steps are not limited to serial numbers thereof. For a person skilled in the art, any change in orders of steps shall also fall within the scope of the present disclosure if without any creative effort.

It should be further appreciated that, the above embodiments have been described in a progressive manner, and same or similar contents in the embodiments may be referred to each other, and each embodiment has merely focused on differences from the others. Especially, method embodiments are substantially similar to product embodiments, and thus have been described in a simple manner, referring to parts of descriptions of product embodiments for details.

Unless otherwise defined, any technical or scientific term used herein shall have common meaning understood by a person of ordinary skills. Such words as "first" and "second" involved in the present disclosure are merely used to differentiate components rather than to represent any order, quantity, or importance. Such terms as "include" or "comprise" or any similar word involved intend to means that an element or item before these terms contains elements or items listed thereafter and equivalents thereof, without excluding other components or objects. "Connect", "couple," or the like is not limited to physical or mechanical connections, but may comprise electrical connections, whether direct or indirect. "Up", "lower", "left", and "right" are used merely to indicate relative positional relationships, which may change accordingly when an absolute position of a described object changes.

It should be appreciated that, in the case that such an element as a layer, a film, a region or a substrate is arranged "on" or "under" another element, it may be directly arranged "on" or "under" the another element, or an intermediate element may be arranged therebetween.

In the description of above embodiments, particular features, structures, materials, or characteristics may be combined in any embodiment or embodiments in an appropriate manner.

The above embodiments are merely for illustrative purposes, but shall not be construed as limiting the scope of the present disclosure. Any person skilled in the art may make modifications or substitutions without departing from the spirit of the present disclosure, and these modifications and substitutions shall also fall within the scope of the present disclosure. Hence, the scope of the present disclosure shall be subject to the scope defined by the appended claims.

What is claimed is:

1. A display substrate, comprising:
a base substrate and a plurality of sub-pixels distributed in arrays and provided on the base substrate,
wherein the plurality of sub-pixels are divided into a plurality of sub-pixel columns;
the display substrate further comprises:
a plurality of data lines, each of which is coupled to respective sub-pixels at a corresponding sub-pixel column;
a plurality of touch electrodes and a plurality of touch signal lines coupled to corresponding touch electrodes, wherein an orthogonal projection of each of the plurality of touch signal lines on the base substrate is adjacent to an orthogonal projection of a corresponding data line among the plurality of data lines on the base substrate, and each of the plurality of touch signal lines comprises first touch portions and second touch portions coupled to each other, the first touch portions and the second touch portions being arranged in different layers, and the second touch portions being of a same material and provided in a same layer as the plurality of data lines;
wherein the plurality of touch signal lines and the plurality of data lines extend along a same direction, and the first touch portions and second touch portions coupled to each other are alternately provided along an extending direction of the plurality of data lines;
wherein the plurality of sub-pixels are divided into a plurality of sub-pixel rows;
the display substrate further comprises a plurality of gate lines, each of which is coupled to respective sub-pixels at a corresponding sub-pixel row;
along the extending direction of the plurality of data lines, orthogonal projections of the plurality of gate lines on the base substrate and orthogonal projections of the first touch portions on the base substrate are alternately arranged;
wherein the plurality of data lines and the plurality of sub-pixel columns are alternately arranged;
the plurality of data lines include a plurality of first data lines and a plurality of second data lines, wherein the plurality of touch signal lines correspond to the plurality of first data lines in a one-to-one manner, and each of the plurality of touch signal lines is adjacent to a corresponding first data line among the plurality of first data lines;
at least a part of neighboring touch signal lines and the plurality of first data lines are arranged between two neighboring sub-pixel columns;
each of the plurality of first data lines comprises first data portions and second data portions alternately provided along an extending direction of the plurality of first data lines, the second data portions being coupled to respective control transistors in corresponding sub-pixels;
each of the plurality of second data lines comprises third data portions, fourth data portions, and fifth data portions arranged sequentially and repeatedly, wherein the fourth data portions are coupled to respective control transistors in corresponding sub-pixels, and orthogonal projections of the fifth data portions on the base substrate at least partially overlap with orthogonal projections of the plurality of gate lines on the base substrate;
a width of each of the third data portions in a direction perpendicular to an extending direction of the third data portions is greater than a width of each of the first data portions in a direction perpendicular to an extending direction of the first data portions, and is greater than a width of each of the first touch portions in a direction perpendicular to an extending direction of the first touch portions.

2. The display substrate according to claim 1, wherein a part of each of the first touch portions is arranged between the second touch portions and the base substrate.

3. The display substrate according to claim 2, wherein the display substrate further comprises a light-blocking layer, and the first touch portions are of a same material and provided in a same layer as the light-blocking layer.

4. The display substrate according to claim 2, wherein the plurality of sub-pixels are divided into a plurality of sub-pixel rows; the display substrate further comprises a plurality of gate lines, each of which is coupled to respective sub-pixels at a corresponding sub-pixel row; and
the first touch portions and the plurality of gate lines are of a same material and provided in a same layer.

5. The display substrate according to claim 1, wherein each of the first touch portions comprises a molybdenum metal layer, an aluminum metal layer, and a molybdenum metal layer sequentially laminated and provided in a direction away from the base substrate.

6. The display substrate according to claim 1, wherein in a same touch signal line, a ratio of a sum of lengths of the first touch portions to a total length of an orthogonal projection of the touch signal line on the base substrate is greater than 50%.

7. The display substrate according to claim 1, wherein in a same touch signal line, each of the first touch portions and its neighboring second touch portion are coupled by a via hole.

8. The display substrate according to claim 1, wherein the plurality of sub-pixels further comprise one or more pixel electrodes, and an orthogonal projection of each of the first touch portions on the base substrate does not overlap with an orthogonal projection of each of the pixel electrodes on the base substrate.

9. The display substrate according to claim 1, wherein the plurality of sub-pixels further comprise one or more common electrodes, and an orthogonal projection of each of the first touch portions on the base substrate at least partially overlaps with an orthogonal projection of each of the common electrodes on the base substrate.

10. The display substrate according to claim 1, wherein orthogonal projections of at least some of the second touch portions on the base substrate partially overlap with orthogonal projections of the plurality of gate lines on the base substrate.

11. The display substrate according to claim 1, wherein the plurality of sub-pixel columns are divided into a plurality of pixel unit columns, each of which comprises at least two neighboring sub-pixel columns, wherein the plurality of touch signal lines and the plurality of pixel unit columns are alternately provided.

12. The display substrate according to claim 1, wherein each of the plurality of sub-pixels comprises a control transistor having a gate electrode coupled to a corresponding gate line and having a first terminal coupled to a corresponding data line, and a pixel electrode to which a second terminal of the control transistor is coupled;
the display substrate further comprises a light-blocking layer including a plurality of light-blocking patterns, wherein orthogonal projections of plurality of the light-blocking patterns on the base substrate at least partially overlap with orthogonal projections of channel portions of corresponding control transistors on the base substrate.

13. A display device comprising a display substrate, the display substrate comprising:
a base substrate and a plurality of sub-pixels distributed in arrays and provided on the base substrate, wherein the plurality of sub-pixels are divided into a plurality of sub-pixel columns;
the display substrate further comprises:
a plurality of data lines, each of which is coupled to respective sub-pixels at a corresponding sub-pixel column;
a plurality of touch electrodes and a plurality of touch signal lines coupled to corresponding touch electrodes, wherein an orthogonal projection of each of the plurality of touch signal lines on the base substrate is adjacent to an orthogonal projection of a corresponding data line among the plurality of data lines on the base substrate, and each of the plurality of touch signal lines comprises first touch portions and second touch portions coupled to each other, the first touch portions and the second touch portions being arranged in different layers, and the second touch portions being of a same material and provided in a same layer as the plurality of data lines;
wherein the plurality of touch signal lines and the plurality of data lines extend along a same direction, and the first touch portions and second touch portions coupled to each other are alternately provided along an extending direction of the plurality of data lines;
wherein the plurality of sub-pixels are divided into a plurality of sub-pixel rows;
the display substrate further comprises a plurality of gate lines, each of which is coupled to respective sub-pixels at a corresponding sub-pixel row;
along the extending direction of the plurality of data lines, orthogonal projections of the plurality of gate lines on the base substrate and orthogonal projections of the first touch portions on the base substrate are alternately arranged;
wherein the plurality of data lines and the plurality of sub-pixel columns are alternately arranged;
the plurality of data lines include a plurality of first data lines and a plurality of second data lines, wherein the plurality of touch signal lines correspond to the plurality of first data lines in a one-to-one manner, and each of the plurality of touch signal lines is adjacent to a corresponding first data line among the plurality of first data lines;
at least a part of neighboring touch signal lines and the plurality of first data lines are arranged between two neighboring sub-pixel columns;
each of the plurality of first data lines comprises first data portions and second data portions alternately provided along an extending direction of the plurality of first data lines, the second data portions being coupled to respective control transistors in corresponding sub-pixels;
each of the plurality of second data lines comprises third data portions, fourth data portions, and fifth data portions arranged sequentially and repeatedly, wherein the fourth data portions are coupled to respective control transistors in corresponding sub-pixels, and orthogonal projections of the fifth data portions on the base substrate at least partially overlap with orthogonal projections of the plurality of gate lines on the base substrate;
a width of each of the third data portions in a direction perpendicular to an extending direction of the third data portions is greater than a width of each of the first data portions in a direction perpendicular to an extending direction of the first data portions, and is greater than a width of each of the first touch portions in a direction perpendicular to an extending direction of the first touch portions.

14. The display device according to claim 13, wherein a part of each of the first touch portions is arranged between the second touch portions and the base substrate.

15. The display device according to claim 14, wherein the display substrate further comprises a light-blocking layer, and the first touch portions are of a same material and provided in a same layer as the light-blocking layer.

16. The display device according to claim 14, wherein the plurality of sub-pixels are divided into a plurality of sub-pixel rows;
   the display substrate further comprises a plurality of gate lines, each of which is coupled to respective sub-pixels at a corresponding sub-pixel row; and
   the first touch portions and the plurality of gate lines are of a same material and provided in a same layer.

17. The display device according to claim 13, wherein in a same touch signal line, a ratio of a sum of lengths of the first touch portions to a total length of an orthogonal projection of the touch signal line on the base substrate is greater than 50%.

18. The display device according to claim 13, wherein the plurality of sub-pixels are divided into a plurality of sub-pixel rows;
   the display substrate further comprises a plurality of gate lines, each of which is coupled to respective sub-pixels at a corresponding sub-pixel row;
   along the extending direction of the plurality of data lines, orthogonal projections of the plurality of gate lines on the base substrate and orthogonal projections of the first touch portions on the base substrate are alternately arranged.

* * * * *